Figure 1:
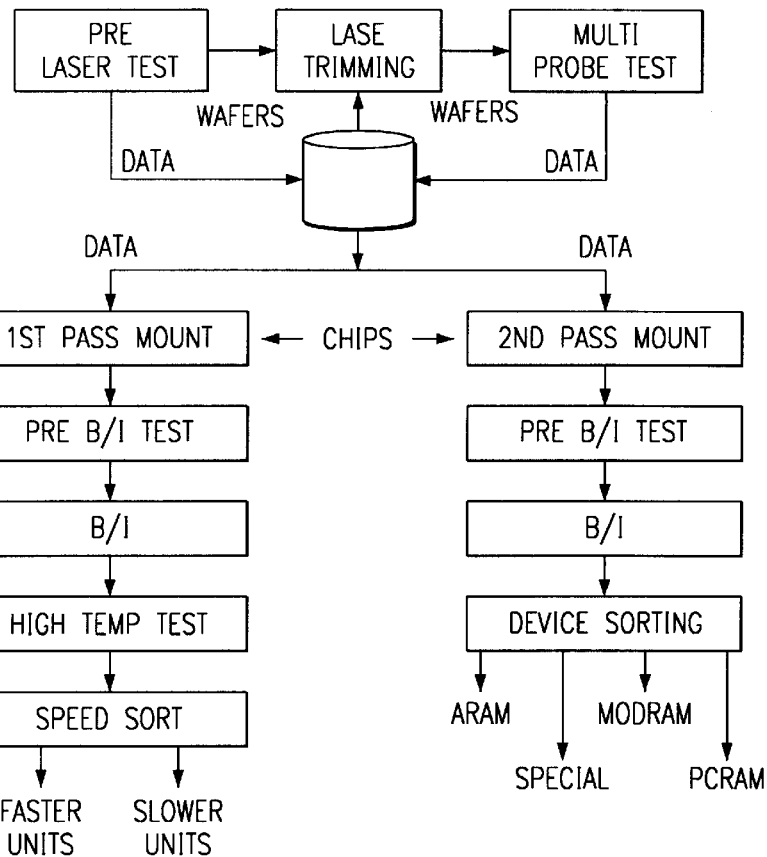

United States Patent [19]
Di Zenzo et al.

[11] Patent Number: 6,130,442
[45] Date of Patent: *Oct. 10, 2000

[54] MEMORY CHIP CONTAINING A NON-VOLATILE MEMORY REGISTER FOR PERMANENTLY STORING INFORMATION ABOUT THE QUALITY OF THE DEVICE AND TEST METHOD THEREFOR

[75] Inventors: Maurizio Di Zenzo, Roccapriora; Giuseppe Savarese, Naples, both of Italy

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/992,607

[22] Filed: Dec. 17, 1997

[30] Foreign Application Priority Data

Dec. 18, 1996 [IT] Italy ................. RM96A0880

[51] Int. Cl.[7] ..................................... H01L 23/58
[52] U.S. Cl. ............................... 257/48; 714/718
[58] Field of Search .................... 365/200, 201; 714/718, 719; 438/17, 18; 257/48

[56] References Cited

U.S. PATENT DOCUMENTS

| | | |
|---|---|---|
| 4,953,277 | 9/1990 | Crispin et al. .......... 29/407.05 |
| 5,256,578 | 10/1993 | Corley et al. . |
| 5,550,838 | 8/1996 | Okajima . |
| 5,895,962 | 4/1999 | Zheng et al. .............. 257/529 |
| 5,907,492 | 5/1999 | Akram et al. ............ 364/468.28 |

FOREIGN PATENT DOCUMENTS

| | | |
|---|---|---|
| 0 578 410 | 1/1994 | European Pat. Off. . |
| 0578410 A2 | 1/1994 | European Pat. Off. . |
| WO 95 09424 | 4/1995 | WIPO . |
| WO 95/09424 A1 | 4/1995 | WIPO . |
| WO 95 34897 | 12/1995 | WIPO . |

*Primary Examiner*—Brian Dutton
*Attorney, Agent, or Firm*—William B. Kempler; Frederick J. Telecky, Jr.

[57] ABSTRACT

An integrated circuit chip which has a volatile memory also has a non-volatile memory for storing the parameter of a volatile memory which was measured while the chip was part of a completed wafer.

21 Claims, 3 Drawing Sheets

TABLE 1
i-th I/O SCRAMBLING TABLE

|  | PHYSICAL ROW ADD | PHYSICAL COL ADD | REDUNDANT DATA I/O SEQUENTIAL NUMBER | REDUNDANT CHIP SEQUENTIAL NUMBER |
|---|---|---|---|---|
| SUBARRAY #1 |  |  |  |  |
| SUBARRAY #2 |  |  |  |  |
| ⋮ |  |  |  |  |
| SUBARRAY #N |  |  |  |  |
|  |  |  |  |  |

MEMORY CHIP CONTAINING A NON-VOLATILE MEMORY REGISTER FOR PERMANENTLY STORING INFORMATION ABOUT THE QUALITY OF THE DEVICE AND TEST METHOD THEREFOR

SPECIFICATION

The present invention broadly relates to volatile memory semiconductor devices and more particularly concerns a memory chip containing a non-volatile memory register, for permanently storing information pertaining to the quality of the device, specially in connection with its speed and failure figure, as well as in respect of a process for testing it.

At present, the manufacture of semiconductor volatile memories, particularly silicon memories, includes three main stages: a chemical treatment stage for silicon, the test program for the devices as manufactured and the assembling stage of the devices satisfactorily tested.

At the end of the chemical treatment stage, very thin slices of silicon are obtained (known to those skilled in the art under the term wafer, usually having a substantially circular shape, subdivided in areas within which the individual memory devices are located (known under the term of chips). The assembly of the memory locations by which said individual chips are formed is organised into a matrix structure which in turn is subdivided into elements designated as sub-arrays, which include a constant number of said memory locations and are autonomously distinguished during the subsequent test stage.

The above said test program subjects the chips to a chain of tests each of which checks the quality and/or the conformity of each individual chip to a preestablished design specification. Said chain of tests can be divided into two sets: a first set, that can be defined as the set of on-wafer tests and includes tests to be made on all of the chips of a wafer and a second set of tests, that can be defined as the set of the assembly tests that includes tests to be made on chips which have overcome the tests of the first set. The on-wafer tests enable to obtain information concerning the failure figures or rates, that is to say the failing sub-arrays, as well as the speed of the chips, on the base of which the failing chips are repaired by exploiting their redundancy, namely the sub-arrays realised in excess just to cope with this possibility; the tests of the first set are concluded by a test aimed at checking the result of the reparation operation. During the on-wafer tests, the maximum amount of information upon each individual chip of each individual wafer is collected in respect of the typology and the topology of the failures and to the speed level. Said information, however, are stored upon computerised maps and are no more utilised in the subsequent steps of the test program, because they are separated from the chips which they pertain to and therefore are difficult and uncomfortable to be looked-up, so that they are definitely useless. This entails that the subsequent sequence of the assembly tests be divided into two distinct paths: a first path in which the quality of all those chips having positively overcome the on-wafer tests in order to sort them according to their speed level and a second path in which the quality of the so-called Secondary Silicon, namely all those chips that have been found to be failing under a certain failure rate during the sequence of the on-wafer tests, in order to sort them according to the failure mechanisms occurring in the various circumstances. Said separation of the assembly test flow makes it necessary to stock all those wafers containing even one only chip of Secondary Silicon until a number of lots sufficient to start the sorting tests of the Secondary Silicon is reached. In addition to the disadvantages associated with stocking of wafers with Secondary Silicon, the assembly test program requires that extremely complex tests be effected in order to obtain chip sorting information details that have already been obtained during the on-wafer tests. This entails a time expenditure that increases the manufacturing costs.

The assembly stage involving all those devices that have overcome the test program enables both the completely operative chips and the Secondary Silicon chips to be mounted for manufacturing memories of various typologies. In particular, it is possible to combine Secondary Silicon chips having compatible failure typology and topology. When it is desired to substitute any failing subarray with not-failing subarrays of other chips mounted in redundant number, a memory map is to be established in order to set up a correspondence between the logical addresses of the assembled memory and the physical addresses of the not-failing subarrays. When it is desired to establish said memory map, a further test sequence is to be carried out in order to operate the chips and to collect information relating to the failures found. The machines used to carry out said latter test sequence on the memory chips are complex and expensive and in addition, also in this case, all collected information details are the same as already obtained during the starting test sequence. This entails an increase in the manufacturing costs and reduces the speed of the manufacturing process.

In conclusion, the manufacture of semiconductor, in particular silicon, volatile memories requires during the test and the assembly stages information concerning the failure rate as well as the speed of the involved chips. However, such information is only available on computerised maps, materially separated from the chips which it is related to, and, therefore, it is often fruitless because it is difficult and uncomfortable to be looked up. This means that this information is to be repeatedly collected in different manufacturing stages, thereby increasing the manufacturing times and costs for said volatile memories.

It is an object of this invention, therefore, to realise memory chips having permanently stored all information concerning their own failure rate and speed, so as to enable it to be looked up in any circumstance it is required by the various steps of the manufacturing process.

It is, therefore, specific subject-matter of this invention to realise semiconductor devices, particularly memory chips, containing a number of non-volatile locations, organised in one or more registers, in order to record information relating to the failure rates and to the speeds, as well as possibly to the diffusion process of the devices within which they are included.

An advantage of the memory location assembly according to this invention is that all information items concerning the failure rates and the speeds as well as to the diffusion process of each individual chi type of each individual wafer are collected only once at the start of the test stage and they are easily and promptly read at the subsequent stages at any time the manufacturing step flow requires it.

In the preferred embodiment, the location assembly forms a register in which the information items are permanently stored by blowing out some fuses by a laser technique. Each bit or location of said register corresponds to a particular subarray of the chip and the information stored therein by blowing or maintaining the fuse pertains the failure of the concerned subarray. Usually, 16 or 32 or 64 subarrays are included in a chip: consequently the register according to the invention has a size of 16 bits or 32 bits or 64 bits, such sizes being known to those skilled in the art as individual memory locations of 1 byte or of 1 word or of 1 nibble. Such register is accessed by means of a particular read operation not compatible with the conventional read/write operations of the concerned volatile memory. Said particular read operation can be comprised of a specific voltage sequence applied to specific pins or the application of a voltage level higher than the levels utilised in conventional operation modes to the address pins. No further explanation is deemed necessary in this respect, since these read operations of particular information are already known and utilised and are perfectly known to those skilled in the art.

A variation of this embodiment could be based upon so-called Flash or EPROM memory locations. Said further embodiment assumes, of course, that an extended area of volatile memory and an area of a few Flash or EPROM memory locations be realised on the same chip.

Further details and advantages of this invention will be evident from the following specification by referring to the enclosed drawings wherein the preferred embodiment is shown by way of illustration and not by way of limitation.

Figure 2:
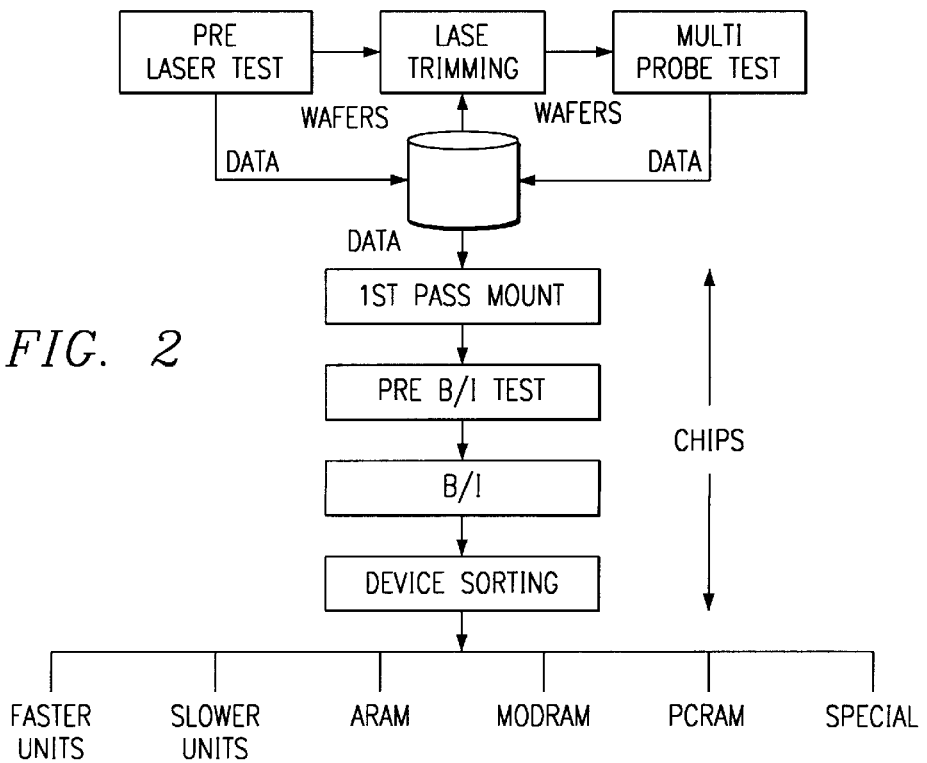
Figure 3:
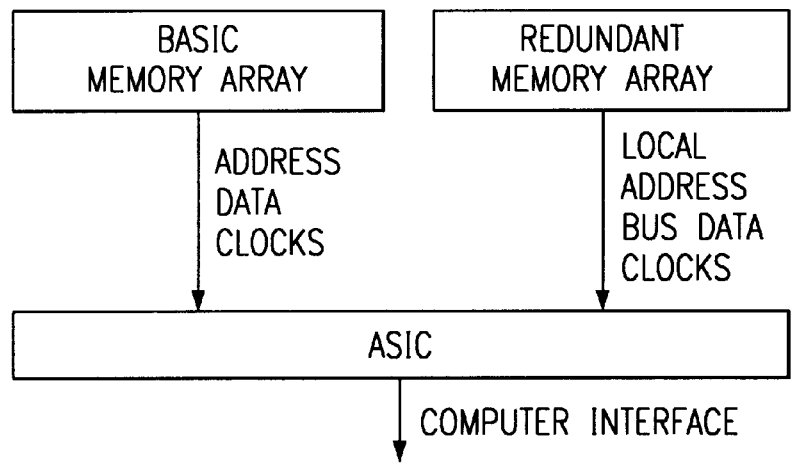
Figure 4:
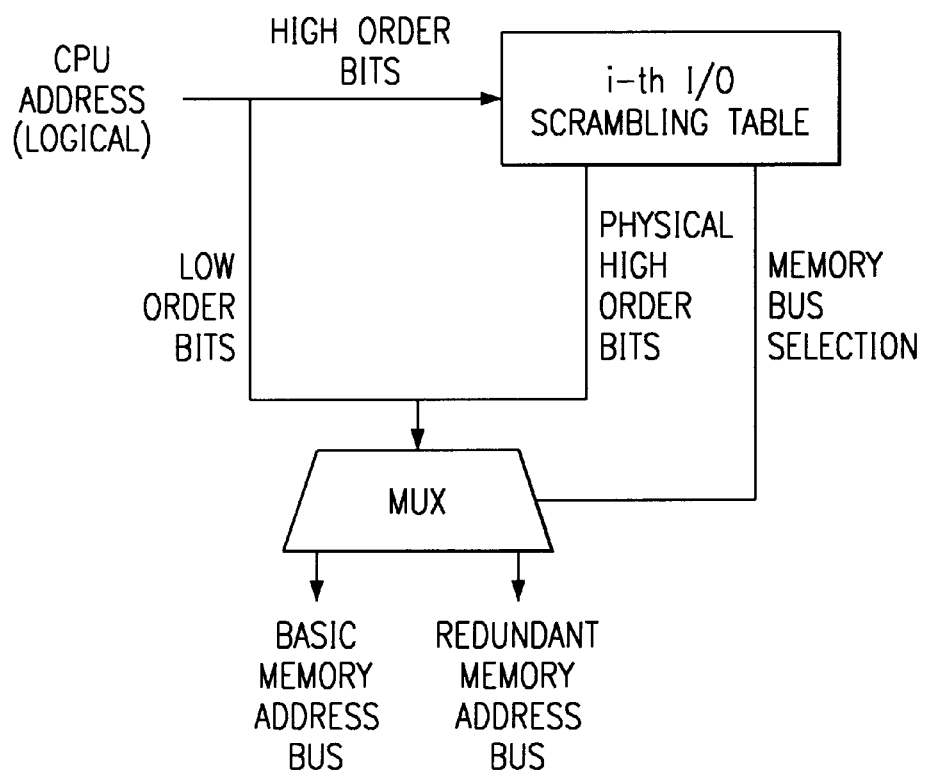
Figure 5:
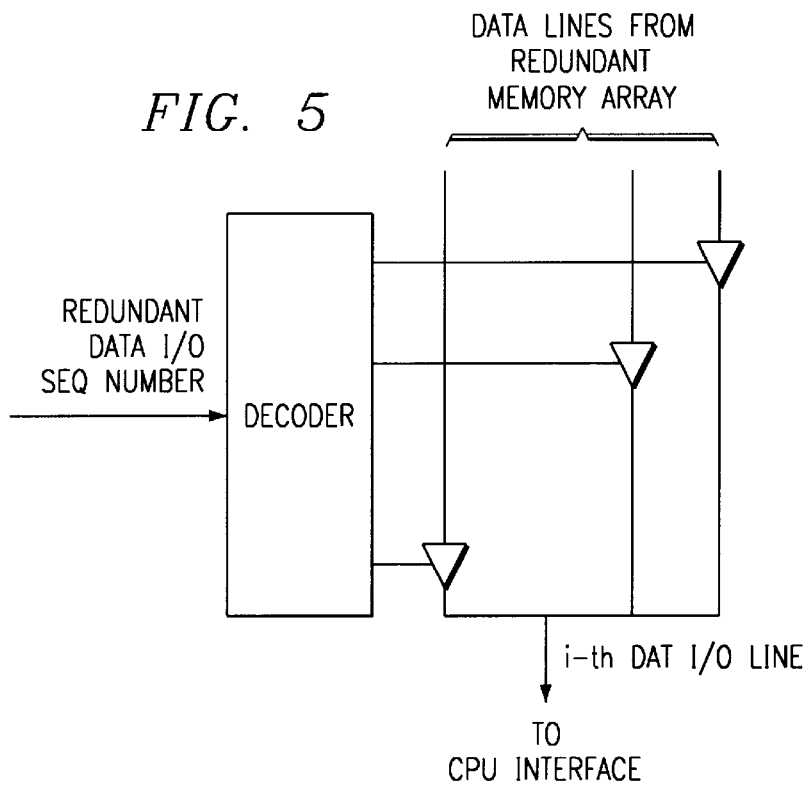

In the drawings:

FIG. 1 shows a block diagram of operations effectively performed during the test stage of the chips for manufacturing non-volatile memories, FIG. 2 shows a block diagram of the operations effectively performed during the test stage of chips provided with a register according to this invention for manufacture of volatile memories, FIG. 3 shows a chip assembly diagram for manufacture of a non-volatile memory, FIG. 4 shows an electric wiring diagram for realising the correlation map between the logic addresses of the assembled memory and the physical addresses of the failure free subarrays, FIG. 5 shows an electric wiring diagram for realising the selection of the data line of the failure free subarray in substitution for the failure affected subarray.

By referring now to FIG. 1, it can be seen that the test program for devices obtained by means of the silicon chemical treatment process for manufacturing volatile memories subjects the chips to a test chain each of which checks the quality and/or the conformity of each individual chip to determined design specifications. Said test chain, as above said, is subdivided into two sets: a first test set, the so-called on-wafer tests, carried out on all chips of the wafers and a second test set, the assembly tests, carried out on all chips having overcome the first set tests.

The on-wafer tests begin with the so-called Pre Laser Test that enables information concerning the failure rate and the speed of the chips to be obtained. Based upon said information concerning the failure rate, the subsequent Laser Trimming step performs the reparation of the failure affected chips by blowing out the fuses that enable to utilise the redundancy, that is to say enable to substitute the sub-arrays that have not overcome the Pre Laser Test with other failure free sub-arrays manufactured in excess on the chip just to cope with this possibility. The subsequent Multi Probe Test checks the results of the reparation operation. During the Pre Laser Test, the failure map for each chip of each wafer is stored in the computer in order to be reutilised during the Laser Trimming stage for determining the best reparation strategies; said failure map stored in the computer is defined as Wafer Map. However, said information items stored in the Wafer Map is no more utilised during the subsequent stages of the test program because they are physically separated from the chips they are related to and, therefore, they are difficult and uncomfortable to be looked up and are consequently dispersed. This entails that the subsequent sequence of the assembly tests be divided into two separate paths: a first path including a quality check on the chips having positively overcome the on-wafer tests based upon the speed level and a second path including a quality check on the Secondary Silicon, which classified based upon the failure mechanism occurring therein.

During the set of the first test path of the assembly tests, the Pre Burn-In Test, the Burn-In step, the High Temp. Test as well as the so-called Speed Sort are carried out, the latter test being designed to sort or to classify the chips based upon their speed level. This classification is performed by carrying out final tests positively designed in order to check whether the concerned chips match the specifications as established in connection with the various speed levels.

The Secondary Silicon chips are subjected to the test set of the second path of the assembly tests, during which the Pre Bum-In Test, the Bum-In step, the High Temp. Test as well as the so-called Device Sorting are carried out, the latter test being designed to sort or to classify the chips by identifying the device category which they belong to, based upon the failure typology. Said classification is realised by carrying out final tests positively designed in order to check whether the concerned chips match the specifications as established in connection with the various device categories (such as ARAM MODRAM, PCRAM).

The procedures comprising the above mentioned assembly tests are well known to those skilled in the art and, therefore, further explanations in this respect are not considered as necessary.

The separation of the assembly test flow into two distinct paths entails, as previously illustrated, the need to store all those wafers containing even a single chip of Secondary Silicon, so as to wait that a sufficient number of lots is reached to start the classification or sorting test for the Secondary Silicon. A further disadvantage of the presently employed manufacturing methodologies is the need that extremely complex tests are to be executed in order to obtain sorting or classification information items of the chip, that have already been obtained, however, during the initial tests on the wafers. This entails an increase in the manufacturing times and costs.

As above said, during the assembly stage, the memory map is to be established based upon the topology of the failures on each individual chip and this is usually realised by suitably programming in permanent way a ASIC. To this purpose, some tests are to be carried out in order to establish the map of the failing subarrays within the chip. The procedure to carry out the tests and to program the above said ASIC turns out to be extremely complex, time consuming and expensive.

By referring now to FIG. 2, it can be observed that the exploitation of the register according to this invention enables the test program to be unified into a single test flow designed to be carried out on all chips of the concerned wafer, thereby avoiding to separate the assembly tests into a path including tests on completely operative chips and a path including tests on the Secondary silicon chips.

The set of on-wafer tests is very similar to the presently utilised one. The main difference is to be observed in that, during the Laser Trimming stage, in addition to the fuse blowing operation aimed at repairing the chip, a fuse blowing operation aimed at storing any information concerning the failing subarrays of the chips is also performed. This means that the storage of the Wafer Map into the computer, even if it is illustrated in FIG. 2, is no more strictly necessary.

The subsequent set of assembly tests enables to check the quality both of the chips that have successfully overcome the on-wafer tests and of the Secondary Silicon chips, thereby maintaining a single manufacture lot up to the final test, specifically associated with each chip sorting class.

The following operation are carried out during the set of assembly tests:

a 1st Pass Mount operation, in which the selection of the failure-free chips is performed, a Pre Burn-In Test operation, in which the chips are tested in order to locate any short-circuit or open-circuit condition, a Burn-In operation, in which the chips, upon being mounted on boards, are operated under stressed temperature and voltage conditions (125° C. and 78 volts) in write/read cycles, so as to eliminate all those chips that are found not to be adapted to withstand such conditions, and a sorting operation for the chips into the various typologies, so as to classify the chips by identifying the category they belong to, based upon their speed and failure grade. Said classification is realised in simple and speedy way, because it is sufficient to carry out a read operation of the registers according to this invention, that is to say a read operation of a single memory location. Only after this operation, the test program flow separates for the various chips based upon the information included in the registers according to this invention, in order to carry out the final tests positively designed to check whether the concerned chips are in compliance with the pre-established specifications connected with the various device categories (such as speedy chips, slow chips, ARAM, MODRAM, PCRAM).

An advantage that is obtained by exploiting a register according to this invention is observed in the noticeable simplification of the manufacturing process, in which it is no more necessary to stock the Secondary Silicon chips and to have two separate manufacturing lots. A further advantage is to be observed in that the storage of information pieces concerning the failure rate and the speed of the chips within the register according to this invention makes them always available for looking up in speedy and simple way, thereby reducing the times needed for execution of the test programs and consequently the manufacturing costs.

During the assembly stage, any information details concerning the failure rates of the chips as stored in the register according to this invention are utilised to build up the memory map based upon the number and upon the topology of all failing subarrays in each individual component chip, by simply programming an ASIC. In fact, said information details enable the various chips to be classified based upon the number and possibly upon the topology of all failing subarrays. Such a classification only needs a simple read operation in the register according to this invention, said read operation being performed in very speedy times since, as above already said, it is a read operation involving a single location. Based upon said classification, Secondary Silicon chips can be assembled upon said memory board, in such an amount as to be sufficient to substitute all failing subarrays with failure free subarrays of other chips mounted in redundant number upon the memory board. Said programming operation of the ASIC can be carried out in two possible ways, both of which are simple and fast and, therefore, advantageous with respect to the current procedures. A first way provides for utilising a computer based system that, by performing a read operation in the registers according to this invention, as furnished upon each of the chips assembled to form the memory board, combined them with one another and consequently programs the ASIC logic. The algorithm for programming the ASIC based upon the information contents of the registers according to this invention is easy to be exploited and, therefore, it does not require a complex computer system, but, in contrast, it only requires a Personal Computer provided with an interface for connection to the concerned ASIC. A second way to program the ASIC, in view of the simplicity of the map generating algorithm, provides for implementing a microcontroller incorporated with the ASIC for performing the read operation of the registers according to this invention, as provided upon the component chips assembled to form the memory board, and, consequently, for programming the ASIC logic.

In view of the above, an advantage that can be obtained during the assembly stage by applying the register according to this invention is to be observed in the simplification of the ASIC programming process, so that it is no more necessary to replicate the tests in order to establish the topology of all failing subarrays incorporated upon each chip, but it is sufficient to carry out a read operation of the registers according to the invention, as provided on each chip. This entails a significant reduction in the assembly times of the memories and consequently a reduction in the manufacturing costs. A further advantage is to be observed in that the extremely complex and expensive machines needed for execution of the test aimed at generating the memory map are no more necessary. This entails a further and significant reduction of the manufacturing costs.

By referring now to FIG. 4, the result of the operation for generating the correlation map between the logic addresses of the assembled memory and the physical addresses of all failing subarrays will be hereinbelow described. The logic address generated by a device accessing to the memory, such as a CPU, is mapped into a physical address that, according to whether the subarray resident upon one of the basic chips, the physical address of which is identical to the logic one, either operative or failing, selects either said subarray resident upon one of the basic chips or the substitution subarray resident upon one of the redundant chips. Said memory map, by which the physical addresses of failure free subarrays are made correspond to the logic addresses of the assembled memory is stored in the ASIC in a so-called address transcoding table. In the binary word forming the physical address of a subarray, the higher order bits are used to select the subarray, while the lower order bits are used too select the individual memory locations within the subarray. This applies both to the physical row address ant to the physical column address. Mapping of a logic address into the physical one is performed by applying to said address transcoding table the higher order bits of the concerned logic address and collecting from the output of said table the higher order bits of the physical address and a multiplexer selection signal. When the subarray resident upon one of the basic chips is operative, the physical address will match the logic address and the selection signal will enroute the address to the multiplexer input over the address bus of the basic memory; otherwise, the physical address will be different from the logic one and the selection signal will enroute the address to the multiplexer input over the address bus of the redundant memory, in order to gain access to the substitution subarray resident upon one of the redundant chips.

By referring now to FIG. 5, all data busses of the subarrays resident upon redundant chips re connected, by means of tri-state input/output stages, to the data bus of the device, such as a CPU, that accedes to the memory. The connection between the data bus of the subarray corresponding to the logic address and the data bus of said device is realised by means of a decoder, driven by a selection signal coming from the address transcoding table stored in the ASIC, which selects the input/output stage of said specific subarray.

A further advantage deriving from the application of the register according to this invention is to be observed in that some manufacturing architecture standards exist, such as for instance SinkLink and Rambus, wherein some registers are provided in the memory and are dedicated to include particular information items, such as the manufacturer code, the memory model, the sizes of the device, the access speed. A register according to this invention could be inserted among those already provided dedicated registers, thereby originating a specialisation of the existing standards.

By summarising all above described, the introduction of a non-volatile memory register into a volatile memory chip in order to record information pieces concerning the failure rate and the speed of the chip into which it is inserted simplifies the test and the assembly stages of the manufacturing cycle for volatile memories and makes it possible to reduce the manufacturing times and costs.

The preferred embodiments of this invention have been described and a number of variations have been suggested hereinbefore, but it should expressly be understood that those skilled in the art can make other variations and changes, without so departing from the scope thereof.

We claim:

1. An integrated circuit chip comprising:
   a volatile memory;
   a non-volatile memory for storing a parameter of said volatile memory which was measured on a completed wafer.

2. The integrated circuit chip of claim 1 wherein said non-volatile memory is organized as a register.

3. The integrated circuit chip of claim 1 wherein said non-volatile memory is a plurality of fuses for being blown in a laser trimming stage.

4. The integrated circuit chip of claim 1 wherein said non-volatile memory is a Flash memory.

5. The integrated circuit chip of claim 1 wherein said non-volatile memory is an EPROM.

6. The integrated circuit chip of claim 2 wherein said non-volatile memory is a plurality of fuses for being blown in a laser trimming stage.

7. The integrated circuit chip of claim 2 wherein said non-volatile memory is a Flash memory.

8. The integrated circuit chip of claim 2 wherein said non-volatile memory is an EPROM.

9. The integrated circuit chip of claim 1 wherein said parameter is the speed distribution of said volatile memory.

10. The integrated circuit chip of claim 1 wherein said parameter is the defect types for said volatile memory.

11. The integrated circuit chip of claim 1 wherein said parameter is the defect topology of said volatile memory.

12. The integrated circuit chip of claim 8 wherein said parameter is the diffusion process for said chip.

13. The integrated circuit chip of claim 2 wherein said parameter is the speed distribution of said volatile memory.

14. The integrated circuit chip of claim 2 wherein said parameter is the defect types for said volatile memory.

15. The integrated circuit chip of claim 2 wherein said parameter is the defect topology of said volatile memory.

16. The integrated circuit chip of claim 2 wherein said parameter is the diffusion process for said chip.

17. The integrated circuit chip of claim 1 wherein said volatile memory is a DRAM.

18. The integrated circuit chip of claim 1 wherein said volatile memory is a DRAM.

19. The integrated circuit chip of claim 17 wherein said parameter is the defect types for said volatile memory.

20. The integrated circuit chip of claim 17 wherein said parameter is the defect topology of said volatile memory.

21. The integrated circuit chip of claim 17 wherein said parameter is the diffusion process for said chip.

* * * * *